(12) United States Patent
Chen et al.

(10) Patent No.: US 7,715,241 B2
(45) Date of Patent: May 11, 2010

(54) METHOD FOR ERASING A P-CHANNEL NON-VOLATILE MEMORY

(75) Inventors: Hsin-Ming Chen, Tainan County (TW); Shih-Chen Wang, Taipei (TW); Sheng-Yu Wang, Hsinchu (TW); Cheng-Yen Shen, Tainan (TW)

(73) Assignee: eMemory Technology Inc., Hsin-chu (TW)

( * ) Notice: Subject to any disclaimer, the term of this patent is extended or adjusted under 35 U.S.C. 154(b) by 128 days.

(21) Appl. No.: 12/056,288

(22) Filed: Mar. 27, 2008

(65) Prior Publication Data

US 2009/0244985 A1    Oct. 1, 2009

(51) Int. Cl.
*G11C 16/04* (2006.01)
(52) U.S. Cl. .............................. 365/185.29; 365/185.18
(58) Field of Classification Search ............ 365/185.29, 365/185.18
See application file for complete search history.

(56) References Cited

U.S. PATENT DOCUMENTS 6,894,924 B2 *   5/2005   Choi et al.   ............. 365/185.01

* cited by examiner

*Primary Examiner*—Huan Hoang
(74) *Attorney, Agent, or Firm*—Jianq Chyun IP Office

(57) ABSTRACT

A present invention relates to a method of erasing a P-channel non-volatile memory is provided. This P-channel non-volatile memory includes a select transistor and a memory cell connected in series and disposed on a substrate. In the method of erasing the P-channel non-volatile memory, holes are injected into a charge storage structure by substrate hole injection effect. Hence, the applied operational voltage is low, so the power consumption is lowered, and the efficiency of erasing is enhanced. As a result, an operational speed of the memory is accelerated, and the reliability of the memory is improved.

6 Claims, 4 Drawing Sheets

METHOD FOR ERASING A P-CHANNEL NON-VOLATILE MEMORY

BACKGROUND OF THE INVENTION

1. Field of the Invention

The present invention relates to a method of operating a semiconductor memory device, and more particularly, to a method of erasing a P-channel non-volatile memory.

2. Description of Related Art

Among various kinds of memory products, the non-volatile memory is a kind of memory characterized by the advantages for multiple data storing, reading or erasing operations. The data stored in the non-volatile memory will be retained even if the power applied to the integrated device is cut off. Hence, the non-volatile memory has become a widely adopted memory device in personal computers and electronic equipments.

In a typical non-volatile memory such as electrically erasable programmable read only memory (EEPROM), a floating gate and a control gate are formed of doped polysilicon. However, when a defect exists in a tunneling oxide layer under the doped polysilicon floating gate, current leakage will occur in the memory device and thus the reliability of the memory device is affected.

Therefore, in the recent non-volatile memory technologies, a charge-trapping layer is also used to replace a doped polysilicon floating gate. A material of the charge-trapping layer is silicon nitride, for example. The silicon nitride charge-trapping layer usually has a silicon oxide layer on its top surface and bottom surface respectively, thus forming an oxide-nitride-oxide (ONO) composite layer. The kind of device is usually called silicon/oxide/nitride/oxide/silicon (SONOS) device.

Since silicon nitride has a characteristic to trap electrons, the electrons injected into the charge-trapping layer would concentrate at a partial area of the charge-trapping layer. Hence, the sensitivity to defects in the tunneling oxide layer is lower and the phenomenon of current leakage in the device is less prone to happen.

FIG. 1 is a schematic diagram showing a method of erasing a non-volatile memory based on the prior art. In FIG. 1, the symbol "●" stands for an electron.

Referring to FIG. 1, a non-volatile P-channel memory is consisted of a substrate 100, an N-type well 102, a SONOS memory cell 104 and a select transistor 106. The SONOS memory cell 104 and the select transistor 106 are connected in series. The SONOS memory cell 104 includes a bottom oxide layer 108, a silicon nitride layer 110, a top oxide layer 112, a control gate 114, a source/drain region 116 and a source/drain region 118. The select transistor 106 includes a gate oxide layer 120, a select gate 122, a source/drain region 118 and a source/drain region 124. To perform an erasing operation, a voltage of 6 volts is applied to the source/drain region 116, N-type well region 102 and the source/drain region 124. And a voltage of 3.3 volts is applied to the select gate 122 so that a channel under the select gate 122 is turned on to equalize potentials of the source/drain regions 118 and source/drain regions 124, and a voltage of −6 volts is applied to the control gate 114 to erase the data stored in the memory cell by the Fowler-Nordheim (F-N) tunneling mechanism.

However, when using the F-N tunneling mechanism to erase data in the SONOS memory cell 104, a threshold voltage of the SONOS memory cell 104 would be decreased with erasing time. However, a voltage difference between the control gate 114 and the substrate 100 also induces electrons from the control gate 114 into the silicon nitride layer 110, resulting in gradual saturation of the threshold voltage, i.e., the so-called erasing saturation phenomenon. As a result, although the erasing time is increased, the erase performance of the device is affected.

FIG. 2 shows a relationship diagram of read current and erasing time obtained by a conventional method of erasing a SONOS memory cell. When using the F-N tunneling mechanism to erase data stored in the SONOS memory cell 104, a method of forming different voltage differences between the control gate 114 and N-type well 102 includes applying different positive voltages to the N-type well 102, the source/drain region 124 and the source/drain region 116, and applying a voltage of 3.3 volts to the select gate 122 so as to turn on a channel under the select gate 122 and to equalize potentials of the source/drain region 118 and the source/drain region 124. A symbol "●" represents applying a voltage of −5.5 volts to the control gate 114, a symbol "▲" represents applying a voltage of −6 volts to the control gate 114, and a symbol "▼" represents applying a voltage of −6.5 volts to the control gate 114. As shown in FIG. 2, when the voltages applied to the control gate 114 are −5.5 volts, −6 volt and −6.5 volts, due to electrons from the control gate injecting into the charge-trapping layer, even if the time of erasing operation is prolonged, read currents still cannot be rapidly reduced. The erase performance is degraded after certain erase time.

Also, as integrity of the device increases, in order to enhance a tunneling efficiency of electrons, a bottom oxide layer of a memory would need to be thinner. Poor charge retention performance becomes a concern when compared to thicker bottom oxide. Hence, it may need longer development time for trade-off between the erase performance and reliability concerns such as charge retention.

SUMMARY OF THE INVENTION

Accordingly, the present invention is directed to a method of erasing a P-channel non-volatile memory. In the method, a low operational voltage is provided to reduce power consumption and increase erasing efficiency so as to accelerate an operating speed of the memory and increase the reliability of the memory.

The present invention relates to a method of erasing a P-channel non-volatile memory. This P-channel non-volatile memory includes a select transistor and a memory cell connected in series and disposed on a substrate. The select transistor includes a select gate disposed on the substrate and a first source/drain region and a second source/drain region disposed in the substrates at both sides of the select gate. The memory cell includes a control gate disposed on the substrate, a charge storage structure disposed between the substrate and the control gate, and a second source/drain region and a third source/drain region respectively disposed in the substrate at both sides of the control gate. When erasing the P-channel non-volatile memory, a first voltage is applied to the substrate, a second voltage is applied to the third source/drain region, and a third voltage is applied to the control gate to inject holes into the charge storage structure by substrate hole injection effect. A voltage difference between the first voltage and the second voltage is sufficient to form a depletion region near the source/drain junction and under the control gate. Moreover, when the voltage difference between the first voltage and the second voltage is large enough to result in the impact ionization in the depletion region (near the source/drain junction), the electron-hole pairs will be generated. Some holes will be re-directed by collisions and acquire the sufficient energies to surmount the oxide barrier. Finally these holes will be caught by charge storage structure under certain third voltage to control gate and electrically compensate the electrons that originally in the charge storage structure. An erase operation for this non-volatile memory cell is completed.

In one embodiment of the present invention, the first voltage is about 5.5 to 6.5 volts, the second voltage is about 0 volt, and the third voltage is about −3 to −4 volts.

In one embodiment of the present invention, the foregoing method of erasing the P-channel non-volatile memory further includes steps of applying a fourth voltage to the first source/drain region, and applying a fifth voltage to the select gate. A voltage difference between the first and the fifth voltage is sufficient to turn on a channel region under the select gate. The first voltage is about 5.5 to 6.5 volts. The second voltage is about 0 volt. The third voltage is about −3 to −4 volts. The fourth voltage is about 0 volt. The fifth voltage is about 0 to 6 volts.

In one embodiment of the present invention, the above-mentioned substrate is an N-type substrate, an N-type well or an N-type well on SOI substrate.

In the method of erasing the P-channel non-volatile memory of present invention, when erasing operation is performed on the P-channel non-volatile memory, holes are injected into the charge storage structure by substrate hole injection effect. Thus, a required voltage for the erasing operation is low, and an electric field between the control gate and the substrate is lowered, so as to reduce power consumption, enhance the efficiency of erasing operation, increase an operating speed of the memory, and also to increase the reliability of the device due to the lower stress on charge storage structure. Besides, the erasing of the memory cell is easily performed by turning on and turning off the select gate under certain inhibited control gate bias and well potential.

Besides, holes are injected into the charge storage structure by a mechanism of substrate hole injection effect, and the thickness of bottom dielectric layer does not affect the erasing speed. Hence, the thickness of the bottom dielectric layer can be increased to prevent any current leakage of the memory device and to enhance the charge retention ability on charge storage structure.

Besides, holes are injected into the charge storage structure by a mechanism of substrate hole injection effect. The erased state of the memory cell can be more OFF when compared to the other erase mechanism (e.g., F-N tunneling operation). F-N tunneling erase is considered as a weak erase mechanism. It needs more trade-off between the F-N erase voltages, erase time and erase state. On the other hand, substrate hole injection enables the more stable short channel effect, which means the reasonable OFF state current is achieved on even shortest channel length of the process corner condition. The memory device will be more flexible for cell design when considering the program and erase operation.

In order to the make the afore mentioned and other objects, features and advantages of the present invention more comprehensible, several embodiments accompanied with figures are described in detail below.

DESCRIPTION OF EMBODIMENTS

Figure 3:
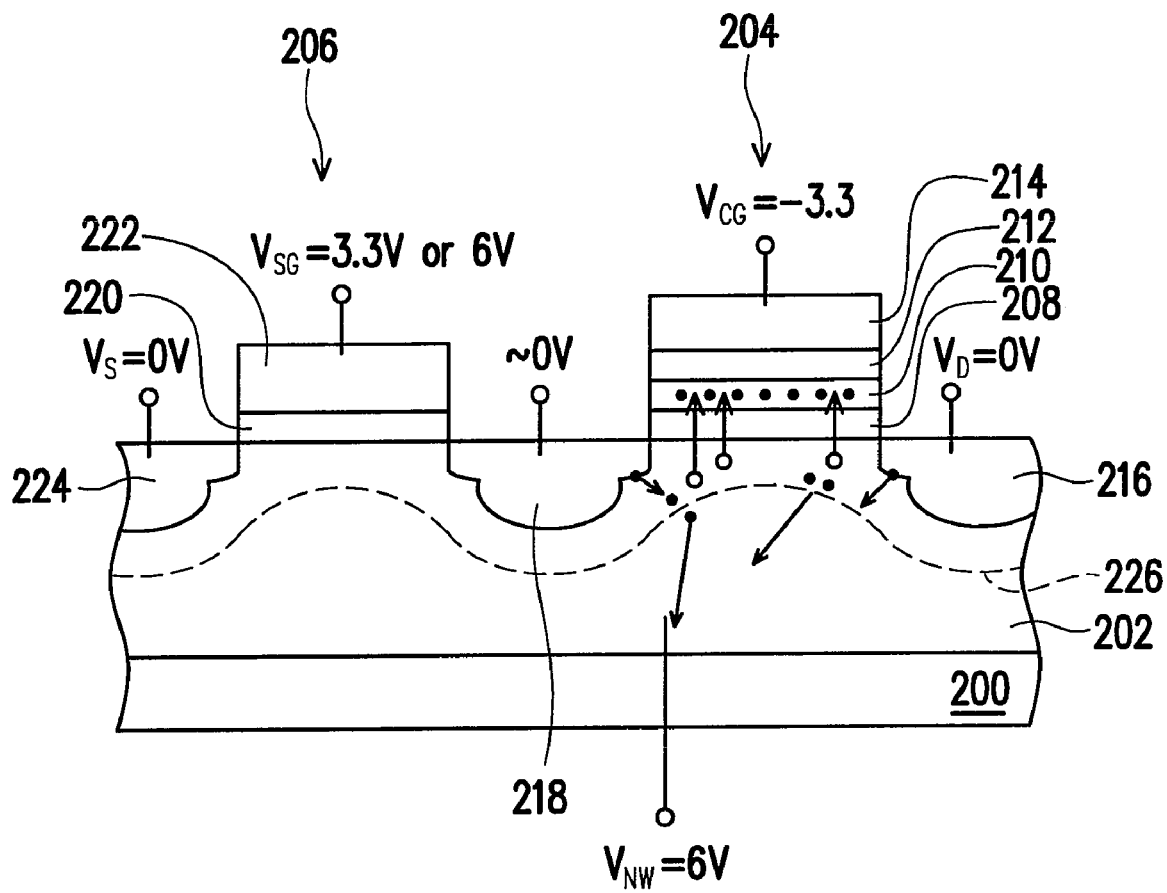
FIG. 3 is a schematic diagram showing one embodiment of a method of erasing a P-channel non-volatile memory according to the present invention.

FIG. 3 is a schematic diagram showing a method of erasing a P-channel memory according to a preferred embodiment of the present invention. In FIG. 3, a symbol "●" represents an electron, and a symbol "○" represents a hole.

Referring to FIG. 3, the P-channel non-volatile memory of the present invention includes a substrate 200, an N-type well 202, a memory cell 204 and a select transistor 206. The substrate 200 is a P-type substrate, for example. The N-type well 202 is disposed in the substrate 200, for example. The memory cell 204 and the select transistor 206 are disposed on the N-type well 202 of the substrate 200. The memory cell 204 and select transistor 206 are connected in series.

The memory cell 204 includes a bottom dielectric layer 208, a charge storage structure 210, a top dielectric layer 212, a control gate 214, a source/drain region 216 and a source/drain region 218. Wherein, the bottom dielectric layer 208, the charge storage structure 210, the top dielectric layer 212, and the control gate 214 are, for example, sequentially disposed on the substrate 200 from bottom to top. The source/drain region 216 and the source/drain region 218 are disposed in the substrate 200 (N-type 202) at both sides of the control gate 214, for example.

The material of bottom dielectric layer 208 and top dielectric layer 212 is silicon oxide, for example. The material of bottom dielectric layer 208 and top dielectric layer 212 can be formed by the other dielectric material. The material of the charge storage structure 210 is a charge-trapping material, such as silicon nitride, silicon oxynitride, tantalum oxide, strontium titanate or hafnium oxide, or a conductive material such as doped polysilicon layer. Besides, the material of the control gate 214 is, for example, conductive materials such as doped polysilicon, metal or metal silicide. The source/drain region 216 and the source/drain region 218 are P-type doped regions, for example. The P-type dopant contained in the source/drain region 216 and the source/drain region 218 is boron or $BF_2$, for example.

It should be noted that, the above-mentioned top dielectric layer 212 may be selectively disposed according to a design of the device. In one embodiment, only the bottom dielectric layer 208 and the charge storage structure 210 may be disposed between the control gate 120 and the substrate 200.

The select transistor 206 includes a gate dielectric layer 220, a select gate 222, the source/drain region 218 and the source/drain region 224. Wherein, the gate dielectric layer 220 and the select gate 222 are, for example, sequentially disposed on the substrate 200 from bottom to top. The source/drain region 218 and source/drain region 224 are, for example, disposed in the substrate 200 at both sides of the select gate 222. The memory cell 204 and the select transistor 206 share the source/drain region 218.

The material of the gate dielectric layer 220 is silicon oxide, for example. The material of gate dielectric layer 220 also may be other dielectric material. Besides, a material of the select gate 222 is, for example, a conductive material such as doped polysilicon, metal or metal oxide. The source/drain region 224 is a P-type doped region, for example. The P-type dopant contained in the source/drain region 224 is boron, for example. Moreover, a lightly doped region may also be disposed in the memory cell 204 and the select transistor 206 to lessen the short-channel effect.

It should be noted that, the P-channel non-volatile memory having the P-type substrate 200 matched with the N-type well 202 is used in the present invention as an example. However, the memory of the present invention may surely be a P-channel non-volatile memory composed not of the N-type well, but of the N-type substrate.

Referring to FIG. 3, in erasing the P-channel non-volatile memory, a voltage $V_{NW}$ is applied to the N-type well 202, a voltage $V_D$ is applied to the source/drain region 216, and a voltage $V_{CG}$ is applied to the control gate 214 so that holes are injected into the charge storage structure 210 by substrate hole injection effect so as to neutralize the electrons in the charge storage structure 210. A voltage difference between the voltage $V_{NW}$ and the voltage $V_D$ is sufficient to form a depletion region 226 under the control gate 214. The voltage $V_{NW}$ is, for example, 6 volts. The voltage $V_D$ is, for example, 0 volt. The voltage $V_{CG}$ is sufficient to pull holes in the depletion region 226 into the charge storage structure 210 to neutralize the electrons in the charge storage structure 210. The voltage $V_{CG}$ is, for example, −3.3 volts.

When applying an reversed bias between the N-type well 202 and the source/drain region 216, as the voltage $V_{NW}$ increases, the depletion region 226 is formed under the control gate 214, and an intensity of an electrical field is also increased, thus forming electron-hole pairs, and resulting in current leakage at an reversed bias junction. At this time, electrons are attracted by the voltage $V_{NW}$ applied to the N-type well 202 and move toward the N-type well 202; and the holes are attracted by the voltage $V_D$ applied to the source/drain region 216 and move toward the source/drain region 216. When the voltage $V_{CG}$ is applied to the control gate 214 and the voltage $V_{CG}$ are more negative relative to the voltage $V_D$, the holes are attracted by the voltage $V_{CG}$ applied to the control gate 214 and move toward the control gate 214, and then are pulled into the charge storage structure 210. When the holes and the foregoing electrons are offset each other, the P-channel non-volatile memory is thereby erased.

In another aspect, when erasing the P-channel non-volatile memory, a voltage $V_S$ is applied to a source/drain region 224, and a voltage $V_{SG}$ is applied to the select gate.

The voltage $V_S$ is, for example, 0 volt. A voltage difference between the voltage $V_{NW}$ and the voltage $V_{SG}$ is sufficient to turn on a channel region under the select gate 222. The voltage $V_{SG}$ is, for example, 0 to 6 volts. The voltage $V_{SG}$ as shown in FIG. 3 is 3.3 volts (The voltage difference between the voltages $V_{NW}$ and $V_{SG}$ is 2.7 volts.) or 6 volts (The voltage difference between the voltages $V_{NW}$ and $V_{SG}$ is 0 volt or floating.).

When a bias is applied to the select gate 222 and thereby turning on the channel region under the select gate 222, the potentials of the source/drain region 218 and the source/drain region 224 are roughly equal. That is, the source/drain region 218 has a voltage substantially equal to the voltage $V_S$. Therefore, the depletion region 226 is also formed under the control gate 214 at the side of the source/drain region 218, and contributes to the electron-hole pair's generation. The current leakage flows at the reversed bias junction. Meanwhile, electrons are attracted by the voltage $V_{NW}$ applied to the N-type well 202 and move toward the N-type well 202; and the holes are attracted by the voltage $V_S$ of a source/drain region 218 and move toward the source/drain region 218. When the voltage $V_{CG}$ is applied to the control gate 214 and the voltage $V_{CG}$ are more negative relative to the source/drain region 218, holes are attracted by the voltage $V_{CG}$ applied to the control gate 214 and move toward the control gate 214, and are pulled into the charge storage structure 210. When the holes and the foregoing electrons are offset each other, the P-channel non-volatile memory is thereby erased.

Figure 4:
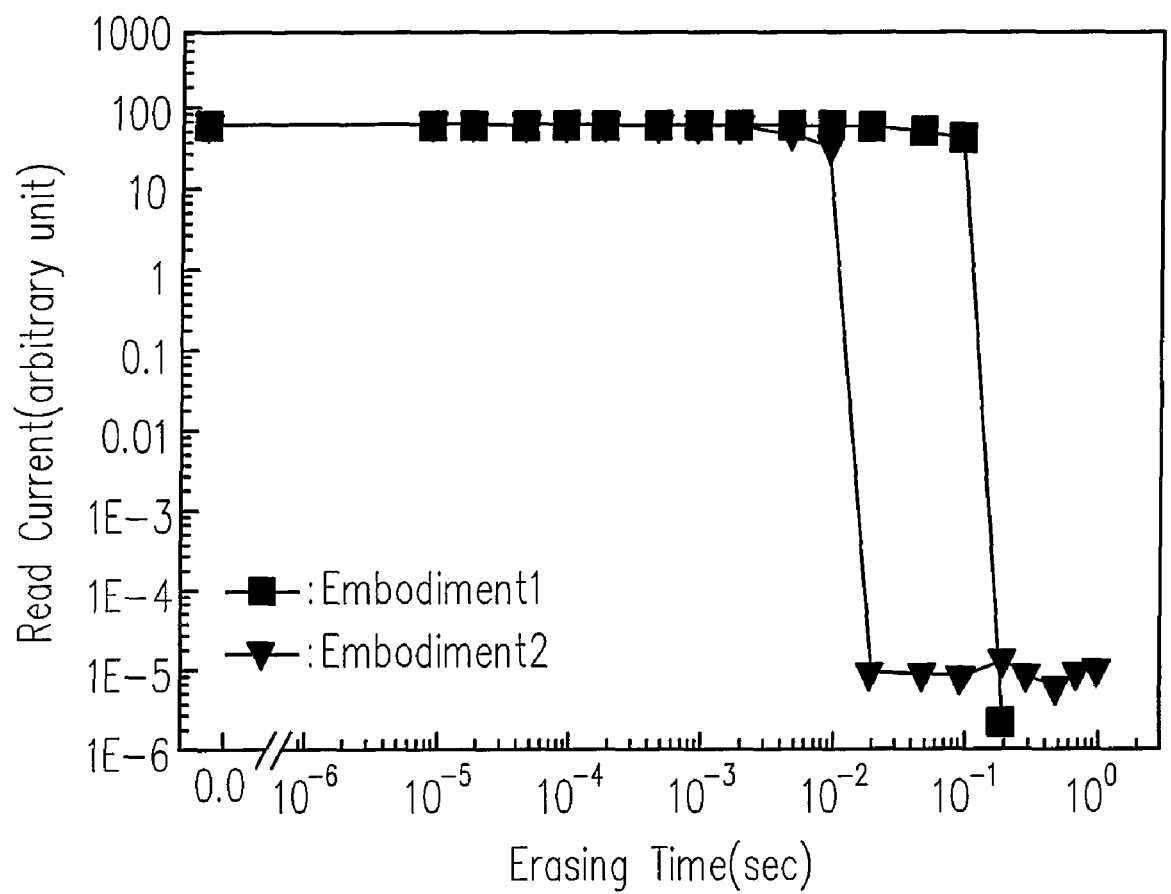
FIG. 4 shows a relationship diagram of read current and erasing time obtained by the method of erasing a non-volatile memory of the present invention under different erase biasing setting.

FIG. 4 shows a relationship diagram of read current and erasing time obtained from the present invention of a method of the erasing non-volatile memory. In Embodiment 1 (represented by a symbol "■"), a voltage of 6 volts is applied to the N-type well 202, a voltage of 0 volt is applied to the source/drain region 216, a voltage of −3 volts is applied to the control gate 214, a voltage of 0 volt is applied to the source/drain region 224, and a voltage of 0 volt is applied to the select gate 222. In Embodiment 2 (represented by a symbol "▼"), a voltage of 6.5 volts is applied to the N-type well 202, a voltage of 0 volt is applied to the source/drain region 216, a voltage of −4 volts is applied to the control gate 214, a voltage of 0 volt is applied to the source/drain region 224, and a voltage of 0 volt is applied to the select gate 222.

As shown in FIG. 4, in Embodiment 1, when an erasing time reaches 0.1 second, the read current rapidly decreases to lower than 1 nA, which means the memory cell has been erased. Similarly, in Embodiment 2, when the erasing time reaches 0.01 second, the read current rapidly decreases to lower than 1 nA, which means the memory cell has been erased.

Figure 1:
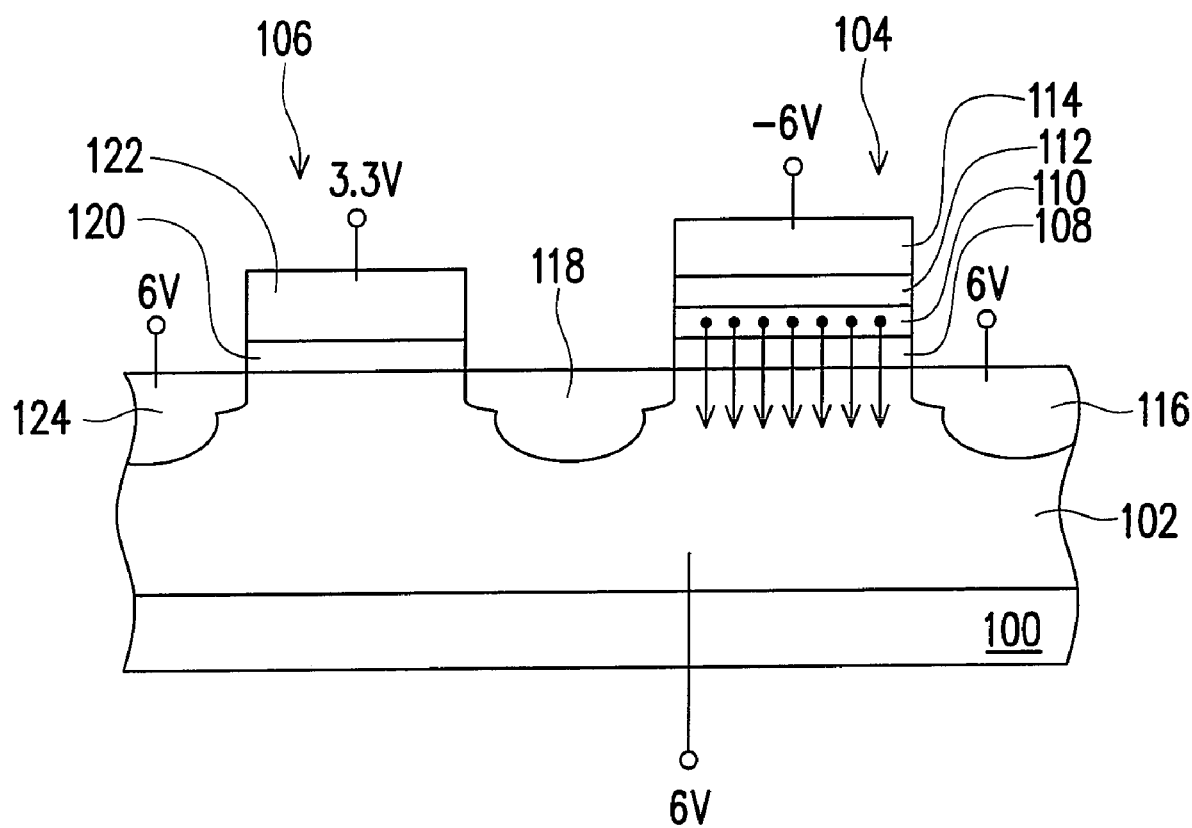
FIG. 1 is a schematic diagram showing a method of conventional F-N erasing a non-volatile memory according to the prior art.
Figure 2:
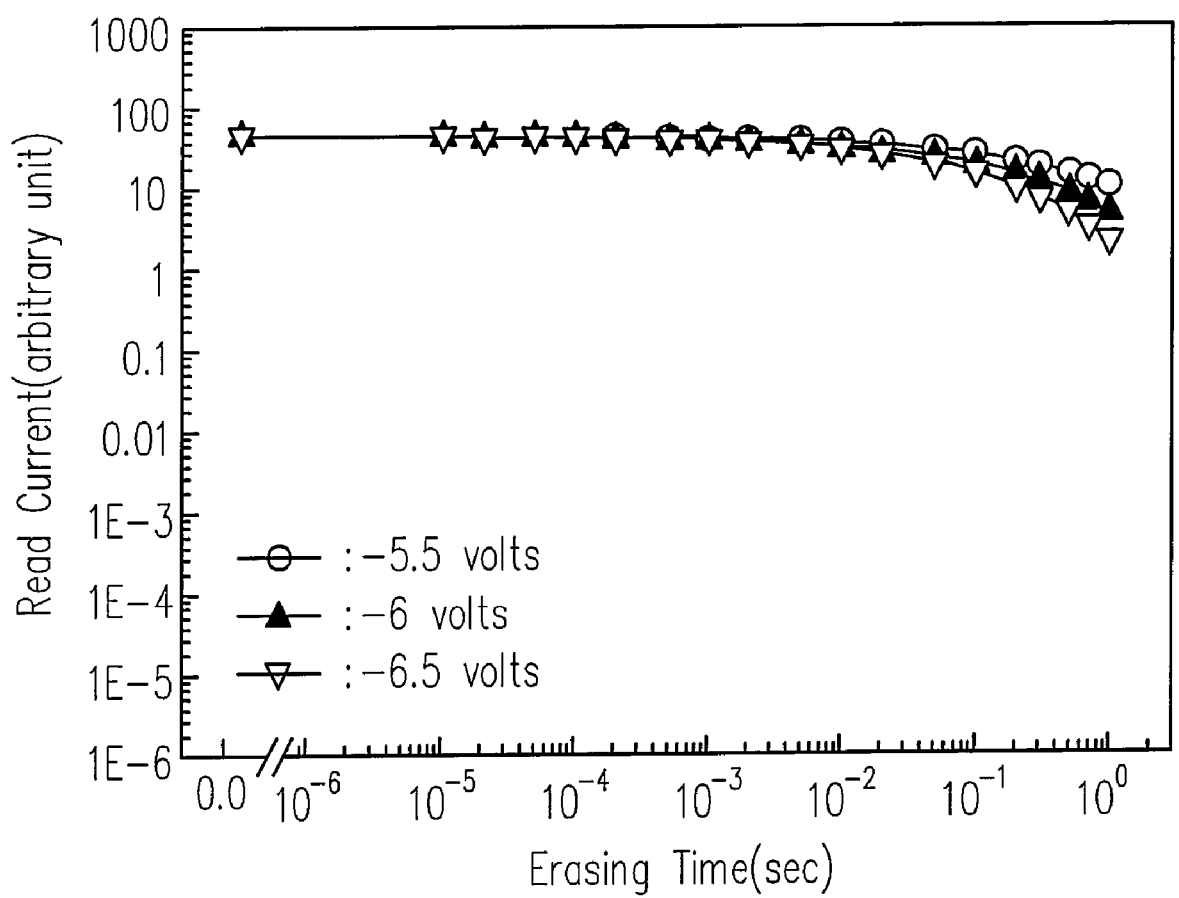
FIG. 2 shows a relationship diagram of read current and erasing time obtained by a conventional method of F-N erasing a P-channel non-volatile memory under different erase voltage.

Referring to both FIG. 2 and FIG. 4, when erasing memory cell by conventional F-N tunneling effect, even though the erasing time reaches over 1 second, the read currents still cannot rapidly reduced to lower than 1 nA. However, when erasing a memory cell by the method of the present invention (substrate hole injection effect), the read current can be rapidly and easily reduced to lower than 1 nA under a condition that an erasing time is shorter than 0.1 second. Hence, comparing the erasing method of the present invention with the conventional F-N tunneling effect, the required operational voltage is low, the power consumption is reduced, the erasing time is shortened, the efficiency of erasing is increased, and the operational speed of the device is accelerated.

In view of the above, in the erasing method of the P-channel non-volatile memory in the present invention, holes are injected into the charge storage structure by substrate hole injection effect. Thus, the required operational voltage is low, and the electric field between the control gate and the substrate is lowered, so as to reduce power consumption and silicon area in peripheral charge pumping circuitry, enhance the efficiency of erasing, accelerate the operating speed of the memory, and increase the reliability of the device. Besides, the erasing of the memory cell is easily performed by turning on and turning of the select gate.

Moreover, holes are injected into the charge storage structure by the mechanism of substrate hole injection effect, and the thickness of the bottom dielectric layer does not affect the erasing speed. Hence, the thickness of the bottom dielectric layer can be increased to prevent current leakage in the memory and to enhance the lifetime and retention of data storage.

Furthermore, holes are injected into the charge storage structure by the mechanism of substrate hole injection effect, the erasing operation is less affected by the size of the channel length, and thus the device is downsized to increase its electrical performance and to increase integrity of the device.

Although the present invention has been disclosed with the above preferred embodiments, the disclosure is not to confine this invention, and it will be apparent to one of the ordinary skill in the art that modifications to the described embodiment may be made without departing from the spirit of the present invention. Accordingly, the scope of the present invention will be defined by the attached claims and not by the above detailed description.

What is claimed is:

1. A method of erasing a P-channel non-volatile memory, the P-channel non-volatile memory comprising:

a select transistor and a memory cell connected in series and disposed on a substrate, wherein the select transistor comprises a select gate disposed on the substrate and a first source/drain region and a second source/drain region disposed in the substrate at both sides of the select gate; and the memory cell comprises a control gate disposed on the substrate, a charge storage structure disposed between the substrate and the control gate, and the second source/drain region and a third source/drain region disposed in the substrate at both sides of the control gate, the erasing method comprising:

applying a first voltage to the substrate, applying a second voltage to the third source/drain region, and applying a third voltage to the control gate to inject holes into the charge storage structure by substrate hole injection effect, wherein a voltage difference between the first voltage and the second voltage is sufficient to form a depletion region under the third source/drain region and the control gate, and the third voltage is sufficient to pull holes in the depletion region into the charge storage structure; and applying a fourth voltage to the first source/drain region, and applying a fifth voltage to the select gate, wherein a voltage difference between the first voltage and the fifth voltage is sufficient to turn on a channel region under the select gate, the first voltage is greater than the second voltage, the second voltage is greater than the third voltage, the fourth voltage is same as the second voltage and the fifth voltage is less than the first voltage.

2. The method of erasing the P-channel non-volatile memory as recited in claim 1, wherein the first voltage is about 5.5 to 6.5 volts.

3. The method of erasing the P-channel non-volatile memory as recited in claim 1, wherein the second voltage is about 0 volt.

4. The method of erasing the P-channel non-volatile memory as recited in claim 1, wherein the third voltage is about −3 to −4 volts.

5. The method of erasing the P-channel non-volatile memory as recited in claim 1, wherein the fourth voltage is about 0 volt.

6. The method of erasing the P-channel non-volatile memory as recited in claim 1, wherein the fifth voltage is about 0 to 5 volts.

* * * * *